United States Patent
Ghosh et al.

(10) Patent No.: US 10,935,492 B2
(45) Date of Patent: Mar. 2, 2021

(54) METROLOGY FOR OLED MANUFACTURING USING PHOTOLUMINESCENCE SPECTROSCOPY

(71) Applicant: Applied Materials, Inc., Santa Clara, CA (US)

(72) Inventors: Avishek Ghosh, Mumbai (IN); Byung-Sung Kwak, Portland, OR (US); Todd Egan, Fremont, CA (US); Robert Jan Visser, Menlo Park, CA (US); Gangadhar Banappanavar, Mumbai (IN); Dinesh Kabra, Mumbai (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 9 days.

(21) Appl. No.: 16/258,392

(22) Filed: Jan. 25, 2019

(65) Prior Publication Data
US 2019/0317021 A1    Oct. 17, 2019

(30) Foreign Application Priority Data
Apr. 13, 2018  (IN) ............................. 201841014177

(51) Int. Cl.
G01N 21/00 (2006.01)
G01N 21/64 (2006.01)
H01L 51/52 (2006.01)

(52) U.S. Cl.
CPC ..... *G01N 21/6489* (2013.01); *G01N 21/6408* (2013.01); *H01L 51/5287* (2013.01)

(58) Field of Classification Search
CPC .................. G01N 21/6408; G01N 21/6489
See application file for complete search history.

(56) References Cited

U.S. PATENT DOCUMENTS

| 7,893,409 B1 | 2/2011 | Cousins |
| 2006/0269782 A1 | 11/2006 | Liao et al. |
| 2007/0036921 A1 | 2/2007 | Twitchen et al. |

(Continued)

FOREIGN PATENT DOCUMENTS

| KR | 20140007019 A | 1/2014 |
| TW | 200305003 A | 10/2003 |
| TW | 200623460 A | 7/2006 |

OTHER PUBLICATIONS

International Search Report and Written Opinion dated Jul. 18, 2019.

(Continued)

*Primary Examiner* — Dani Fox
(74) *Attorney, Agent, or Firm* — Patterson + Sheridan, LLC

(57) ABSTRACT

An apparatus for determining a characteristic of a photoluminescent (PL) layer comprises: a light source that generates an excitation light that includes light from the visible or near-visible spectrum; an optical assembly configured to direct the excitation light onto a PL layer; a detector that is configured to receive a PL emission generated by the PL layer in response to the excitation light interacting with the PL layer and generate a signal based on the PL emission; and a computing device coupled to the detector and configured to receive the signal from the detector and determine a characteristic of the PL layer based on the signal.

21 Claims, 12 Drawing Sheets

(56) References Cited

U.S. PATENT DOCUMENTS

2007/0187580 A1     8/2007   Kykta et al.
2012/0326054 A1*   12/2012   Meloni .............. G01N 21/6489
                                                                           250/459.1

OTHER PUBLICATIONS

Taiwan Office Action dated Dec. 17, 2019 for Application No. 108112466.
Taiwan Office Action dated Mar. 26, 2020 for Application No. 108112466.

* cited by examiner

METROLOGY FOR OLED MANUFACTURING USING PHOTOLUMINESCENCE SPECTROSCOPY

CROSS-REFERENCE TO RELATED APPLICATIONS

This application claims benefit of Indian provisional patent application serial number 201841014177, filed Apr. 13, 2018, which is hereby incorporated herein by reference.

BACKGROUND

Field

Embodiments of the present disclosure generally relate to non-destructive in-situ metrology for monitoring uniformity and/or dopant concentration in a layer using static and nanosecond transient photoluminescence spectroscopy.

Description of the Related Art

Organic light-emitting diodes (OLEDs) are light-emitting diodes (LEDs) that include an organic semiconductor layer that emits light in response to an electric current. This organic semiconductor layer, referred to as an emissive electroluminescent layer, is positioned between two electrodes, one of which is typically transparent (or both electrodes in the case of transparent displays). OLEDs are used to create emissive digital displays in devices such as television screens, computer monitors, mobile phones, handheld game consoles, and personal digital assistants (PDAs). The pixels of an OLED display are formed from the organic semiconductor layers, and therefore emit visible light themselves. As a result, unlike a liquid crystal display (LCD), an OLED display operates without a backlight. Consequently, OLED displays are generally thinner and lighter than equivalent liquid crystal displays (LCDs), and produce deeper blacks and achieve higher contrast ratios than LCDs.

An active-matrix OLED (AMOLED) display includes a high density array of organic electroluminescent pixels situated on a backplane that directly accesses and switches each individual pixel on or off. The electroluminescent pixels are each formed from a stack of various organic layers that are selectively deposited on the TFT backplane and bound by thin-film cathode and anode layers. The organic layers that make up each electroluminescent pixel generally include an electron injection layer (EIL), an electron transport layer (ETL), an emissive layer (EML), a hole transport layer (HTL), and a hole injection layer (HIL). The quality and uniformity of each of these layers can significantly affect the performance of the pixel and the OLED display as a whole. For example, a variation in dopant concentration in a layer as small as a fraction of 1% can alter the dynamics of charge carriers in the layer, which in turn affects the photoluminescent behavior of the layer. Variations in thickness of one or more of these organic layers can also impact device efficiency.

The various organic layers of an OLED are typically formed in a single high-vacuum deposition system, where each layer is deposited on the backplane via a different chamber of the system. As a result, an OLED device cannot be accessed and tested until the entire OLED formation process has completed, which can last up to several hours, during which a large number of substrates are typically processed. Consequently, a process excursion in a single chamber can affect a large number of devices before being detected. Thus, such a delay in the detection of and response to a process excursion can be costly in terms of yield loss.

In addition, in the current state of the art, metrology techniques for OLED devices are relatively time-consuming and are employed after all organic layers have been deposited, which can also delay detection of process excursions. Further, conventional metrology techniques for OLED devices are generally most accurate when applied to a significantly thicker OLED layer than actual OLED device layer thickness. As a result, the signal produced when measuring the small changes associated with production layers of OLED devices can be inadequate for generating reliable feedback for the deposition process.

Accordingly, there is a need in the art for systems and methods that enable fast and accurate monitoring of the properties of the individual layers of an OLED device.

SUMMARY

According to various embodiments, an apparatus comprises: a light source that generates an excitation light that includes light from the visible or near-visible spectrum; an optical assembly configured to direct the excitation light onto a photoluminescent (PL) layer formed on a substrate that is disposed in a system for depositing the PL layer; a detector that is configured to receive a PL emission generated by the PL layer in response to the excitation light interacting with the PL layer and generate a signal based on the PL emission; and a computing device coupled to the detector and configured to receive the signal from the detector and determine a characteristic of the PL layer based on the signal.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Figure 1A:
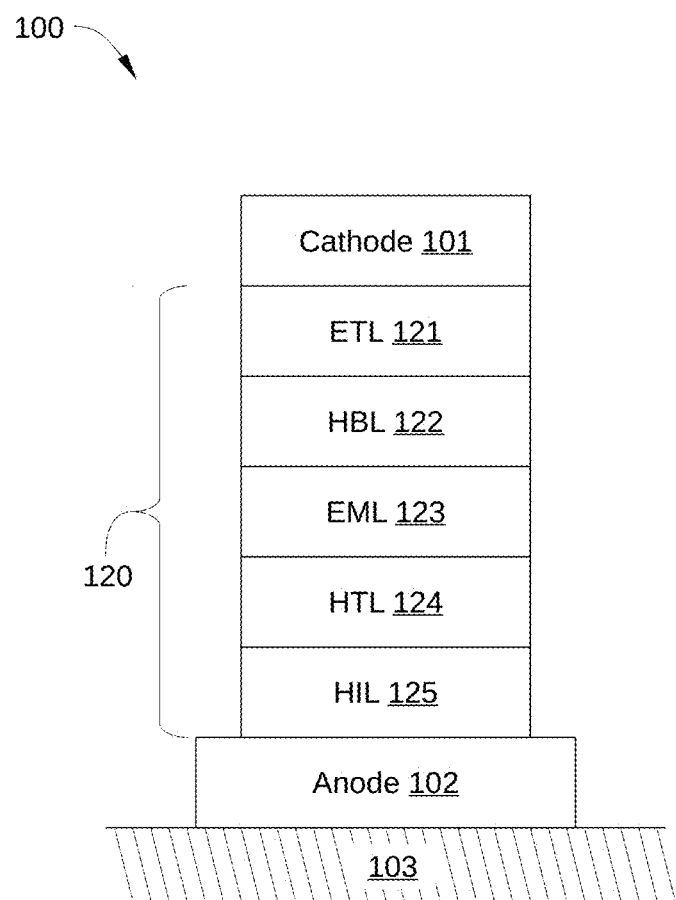
FIG. 1A is a schematic illustration of the various layers of a typical organic light-emitting diode (OLED) device.

FIG. 1A is a schematic illustration of the various layers of a typical organic light-emitting diode (OLED) device 100. As shown, OLED device 100 includes a plurality of organic semiconductor layers 120 formed between a cathode layer 101 and an anode layer 102. Cathode layer 101, anode layer 102, and organic semiconductor layers 120 are disposed on a glass or other substrate 103, and can each be formed via the selective deposition of thin films using thin film deposition techniques known in the art. In one example, OLED device 100 is a single pixel in an OLED display.

Organic semiconductor layers 120 can include, without limitation, an electron transport layer (ETL) 121, a hole-blocking layer (HBL) 122, an emissive layer (EML) 123, a hole transport layer (HTL) 124, and a hole injection layer (HIL) 125, among others. Together, organic semiconductor layers 120 provide the light-emitting functionality of OLED device 100. In FIG. 1, OLED device 100 is depicted with five organic semiconductor layers, but in some cases OLED device 100 includes more or fewer organic semiconductor layers. For example, organic semiconductor layers 120 may include, additionally or alternatively, an electron injection layer, an electron blocking layer, and the like.

For proper operation of OLED device 100, such as uniform color and brightness relative to other pixels in the same OLED display, certain film characteristics for each of the organic semiconductor layers 120 should be maintained within a specified range. Examples of such characteristics include thickness and thickness uniformity of a layer, the concentration of dopant molecules within the host molecules of a layer (dopant concentration), and uniformity of the dopant concentration across a layer (dopant uniformity). According to various embodiments of the present disclosure, some or all of these film characteristics can be measured non-destructively after being deposited on substrate 103 while substrate 103 is in-situ, in-line, and/or at end-of-line, as illustrated in FIG. 1B.

Figure 1B:
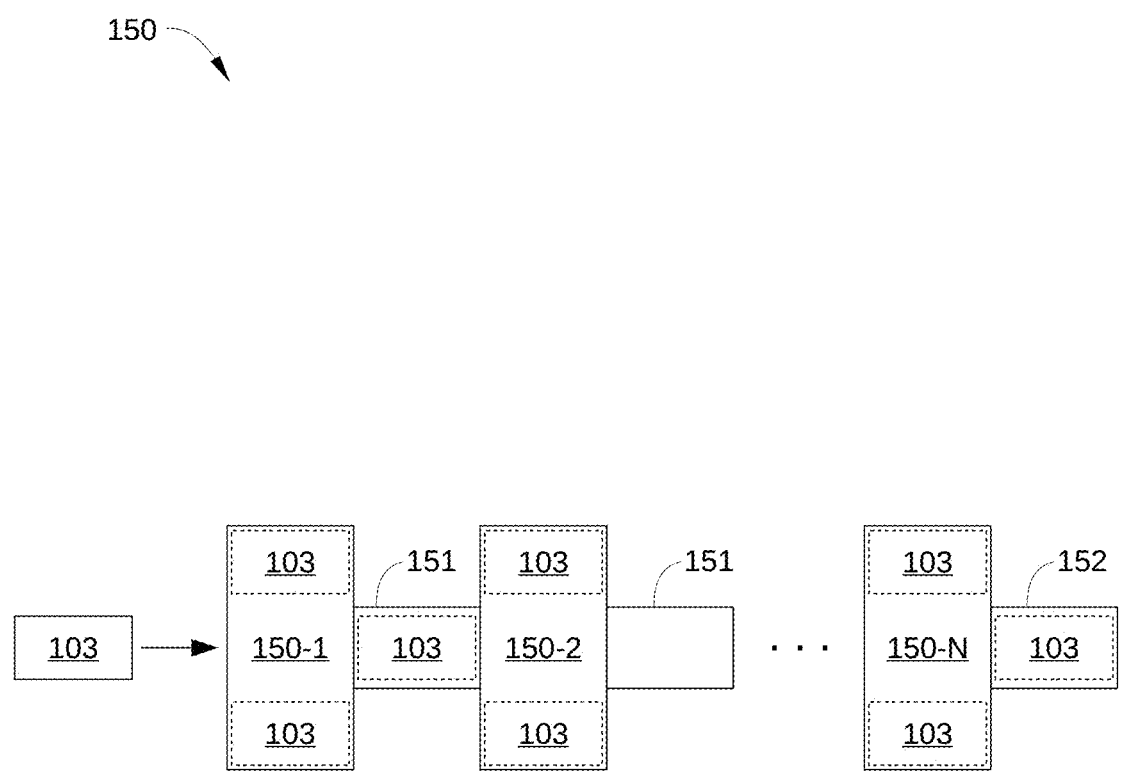
FIG. 1B is a schematic illustration of an OLED fabrication system in which various embodiments of the present disclosure can be implemented.

FIG. 1B is a schematic illustration of an OLED fabrication system 150 in which various embodiments of the present disclosure can be implemented. As shown, OLED fabrication system 150 includes multiple deposition chambers 150-1, 150-2, . . . 150N, each configured to deposit one of N different OLED layers on a substrate, such substrate 103 in FIG. 1A. In addition, OLED fabrication system 150 includes transfer chambers 151 disposed between each of deposition chambers 150-1-150-N and a load lock 152 for the removal of substrates 103. Generally, prior to removal of substrates 103 and after all active layers are completed, a so-called the capping layer (CPL), which is not shown in FIG. 1A, is deposited on substrate 103. CPLs are typically transparent organic materials that are similar in composition to other OLED materials.

According to various embodiments of the present disclosure, certain OLED characteristics can be measured non-destructively after being deposited on substrate 103 while substrate 103 is still in-situ, i.e., while substrate 103 is within the deposition chamber that is forming a particular organic semiconductor layer 120. Alternatively or additionally, in some embodiments, certain film characteristics can be measured non-destructively immediately after being deposited on substrate 103, when substrate 103 is in-line. That is, the film characteristics are measured when substrate 103 is disposed between two of the deposition chambers of OLED fabrication system 150. For example, the in-line measurement(s) can be performed when substrate 103 is disposed in a transfer chamber 151. Thus, in such embodiments, the film characteristics for a specific semiconductor layer 120 is measured non-destructively in real-time, after being deposited on substrate 103 and before the deposition of subsequent semiconductor layers 120. Alternatively or additionally, in some embodiments, certain film characteristics can be measured non-destructively when substrate 103 is at end-of-line, i.e., when deposition processes have been completed on substrate 103, but substrate 103 has not been removed from OLED fabrication system 150. That is, the film characteristics are measured while substrate 103 is disposed in load lock 152 or some other end-of-line chamber of OLED fabrication system 150. In such embodiments, the film characteristics can be measured prior to deposition of a thin film encapsulant layer on substrate 103 and prior to exposure of substrate 103 to atmosphere. In any of these situations, monitoring of one or multiple film characteristics is performed without stopping the fabrication process. As a result, production losses associated with system idle time are minimized or otherwise reduced. Further, because the monitoring of such film characteristics can be performed immediately after deposition of each organic semiconductor layer 120, process issues with a specific deposition chamber can be detected in real time, and not after a complete batch of substrates 103 has completed processing.

Figure 2:
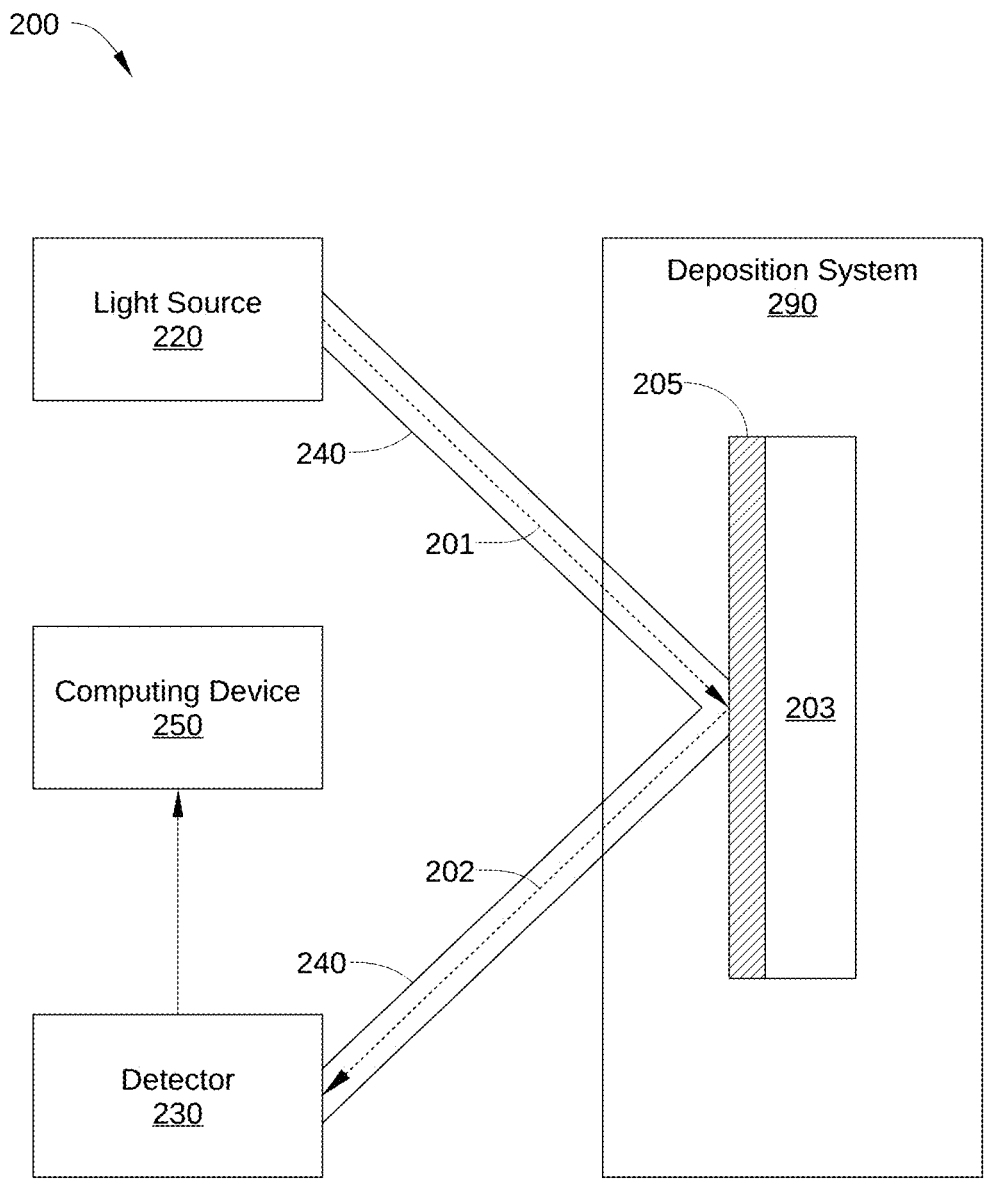
FIG. 2 is a conceptual block diagram of an OLED layer monitoring system, according to various embodiments of the present disclosure.

FIG. 2 is a conceptual block diagram of an OLED layer monitoring system 200, according to various embodiments of the present disclosure. OLED layer monitoring system 200 is configured to provide in-situ and non-destructive monitoring of dopant concentration and film thickness of some or all of the organic semiconductor layers 120 shown in FIG. 1. In addition, the measurements performed by OLED layer monitoring system 200 can provide dopant concentration level and uniformity and film thickness and its uniformity for one or more of organic semiconductor layers 120. OLED layer monitoring system 200 includes a light source 220 configured to generate an excitation light 201, a detector 230 configured to receive a photoluminescent (PL) emission 202, and a computing device 250 coupled to detector 230. OLED layer monitoring system 200 further includes an optical assembly 240 configured to direct excitation light 201 to a PL layer 205 formed on a substrate 203 and to direct PL emission 202 to detector 230.

As shown, OLED layer monitoring system 200 performs one or more measurements on PL layer 205 while substrate 203 is disposed within a deposition system 290. Specifically, OLED layer monitoring system 200 causes PL layer 205 to be excited with excitation light 201 and measures PL emission 202 that occurs as a result of the excitation of PL layer 205. Computing device 250 then determines one or more film characteristics of PL layer 205 based on the measured excitation, as described below. Deposition system 290 can be any technically feasible system for depositing one or more PL layers 205 on substrate 203. For example, in some embodiments, deposition system 290 includes one or more evacuated deposition chambers that have a low partial pressure of oxygen therein during processing. Alternatively or additionally, deposition system 290 includes one or more atmospheric pressure or low-vacuum deposition chambers that can operate with an inert gas disposed therein.

PL layer 205 can be an OLED layer or any other layer of material that emits light of a first frequency in response to excitation from light of a second frequency that is higher than the first frequency. For example, PL layer 205 can include a layer of material that includes quantum dots, light-emitting diodes and the like. In some embodiments, PL layer 205 includes an organic photo-luminescent layer.

Light source 220 can be any technically feasible light source that generates a suitable excitation light 201 for exciting PL layer 205. In some embodiments, light source 220 is configured to generate excitation light 201 is selected in wavelength and intensity so that the chemical properties of PL layer 205 are not chemically altered. For example, in some embodiments, the power of excitation light 201 can be limited to avoid photo-bleaching of PL layer 205. In one such embodiment, the power of excitation light 201 can be limited to no more than about 1 µW. In other embodiments, the power of excitation light 201 can be varied depending on the particular material included in PL layer 205 and the duration of exposure of PL layer 205 to excitation light 201. Thus, in some embodiments, the power of excitation light 201 can as much as about 10 µW.

In some embodiments, light source 220 includes one or more lasers that each generate a specific excitation light 201 for a particular PL layer 205, so that the particular PL layer 205 can be excited by the appropriate specific excitation light. For example, in such embodiments, light source 220 may include a tunable laser that selectively generates a first wavelength light (e.g., 405 nm light) for exciting a first PL layer 205 and a second wavelength light (e.g., 375 nm light) for exciting a second PL layer 205. Alternatively or additionally, in such embodiments, light source 220 may include multiple lasers that are each employed for generating excitation light 201 for a different PL layer 205. In some embodiments, light source 220 includes a broadband light source, such as a white plasma-based light source, a white light-emitting diode (LED), or some other light source that generates light in the 350-400 nm wavelength range. In some embodiments, light source 220 is a single light source that is employed to generate excitation light 201 having the same frequency for the excitation of any PL layer 205 that is measured by OLED layer monitoring system 200. For example, in such an embodiment, light source 220 includes a laser that generates an excitation light 201 having a single fixed frequency of light or a single fixed range of frequencies of light between about 300 nm and about 450 nm.

For clarity, in the embodiment illustrated in FIG. 2, excitation light 201 is depicted to be incident on PL layer 205 at a non-normal angle of incidence 209. In other embodiments, angle of incidence 209 can be 90°, or any other suitable angle for a particular configuration of OLED layer monitoring system 200, Detector 230 is configured to receive PL emission 202 when PL layer 205 is excited by excitation light 201, and can include any suitable light detector. As will be discussed further below, the PL emission 202 will have a different set of wavelengths from the one or more wavelengths found in excitation light 201. For example, in some embodiments computing device 250 employs a spectral intensity of PL emission 202 to determine one or more film characteristics of PL layer 205. In such embodiments, detector 230 includes a spectrometer configured to quantify a radiant intensity for each of a plurality of wavelengths of light included in PL emission 202. In such embodiments, the spectrometer generally includes a grating and/or other optical elements to spatially disperse the various frequencies of light included in PL emission 202. In addition, a suitable detector is optically coupled to or included in the spectrometer, such as an array of photodetectors or charge-coupled devices (CODs) that each quantify a PL intensity for a different portion of the spectrum of PL emission 202. Thus, the spectrally dispersed PL light is imaged by the CCD image sensor pixels at the focal plane of the spectrometer where the CCD image sensor is located. The CCD pixels are calibrated for the wavelength range with a suitable calibration lamp such that each pixel represents a specific wavelength and the PL spectrum can be directly recorded on the CCD sensor.

Alternatively or additionally, in some embodiments, computing device 250 employs a single intensity value associated with PL emission 202 to determine one or more film characteristics of PL layer 205. In such embodiments, detector 230 includes a suitable device for quantifying incident light intensity, such as a photomultiplier tube or photon-counters. In such embodiments, detector 230 may further include an optical filter or other optical element configured to selectively transmit light of a specified wavelength or wavelength band, so that light detected by detector 230 is limited to the specified wavelength or wavelength band.

Computing device 250 includes logic configured to receive signals from detector 230 and to determine one or more film characteristics of one or multiple PL layers 205 formed on substrate 203. Computing device 250 can be any computing device suitable for practicing one or more embodiments of the present disclosure. Computing device 250 may be implemented as a central processing unit (CPU), a graphics processing unit (GPU), an application-specific integrated circuit (ASIC), a field programmable gate array (FPGA), any other type of processing unit, or a combination of different processing units, such as a CPU configured to operate in conjunction with a GPU. In general, computing device 250 may be any technically feasible hardware unit capable of processing data and/or executing software applications for implementing one or more embodiments of the present disclosure. Further, computing device 250 may correspond to a physical computing system, or may be a virtual computing instance executing within a computing cloud. In some embodiments, the functionality of computing device 250 is incorporated into deposition system 290.

In some embodiments, computing device 250 determines a dopant concentration of PL layer 205 by measuring a transient photoluminescence of PL layer 205 and comparing the measured transient photoluminescence to a previously established calibration curve, table, or function. As described below, transient photoluminescence in organic semiconductor layers is a function of dopant concentration, and is generally unaffected by thickness of the organic semiconductor layer. Transient photoluminescence (TPL) of an organic semiconductor layer is generally determined by measuring the decay over time of the photoluminescence intensity, at one or more wavelengths, generated by exposing a portion of an organic semiconductor layer to an amount of radiation generated by a light source (e.g., pulse of the excitation light 201). In TPL, the photoluminescence spectrum is monitored as a function of delay between excitation pulse and CCD gate pulse that records the PL intensity. The kinetics of PL decay is indicative of the outflow of excitation energy, which in turn is indicative of the host:dopant ratio in the emissive layer. In the emissive layer, the host molecular system is excited, which in turn transfers the excitation energy via intersystem crossing over to the excited dopant molecular system. Subsequently, the excited dopant relaxes to the ground state, releasing energy in form of photoluminescence. Hence, the larger the dopant concentration, the faster the PL decay, which is what is observed in the TPL monitoring system described herein. The PL decay kinetics are independent of layer thickness but very sensitive to the host:dopant ratio in the emissive layer.

In some embodiments, computing device 250 determines a doping concentration of PL layer 205 by performing a thickness measurement (for example via reflectometry) and measuring a static photoluminescence of PL layer 205. Based on the thickness measurement and the static photoluminescence measurement, computing device 250 then determines the dopant concentration. Specifically, computing device 250 can determine the dopant concentration of PL layer 205 by comparing the measured static photoluminescence to a previously established calibration curve, table, or function that is associated with the measured thickness of a particular PL layer 205. Thus, even though the static photoluminescence of PL layer 205 is a function of both the thickness of PL layer 205 and the concentration of dopant included in PL layer 205, computing device 250 can determine a thickness of PL layer 205 by measuring static photoluminescence of PL layer 205.

Alternatively or additionally, in some embodiments, computing device 250 determines a thickness of PL layer 205 by measuring a transient photoluminescence of PL layer 205 and a static photoluminescence of PL layer 205. In such embodiments, computing device 250 first determines a dopant concentration of PL layer 205 by measuring a transient photoluminescence of PL layer 205 and comparing the measured photoluminescence to a first calibration curve, table, or function. Computing device 250 then determines a thickness of PL layer 205 by measuring a static photoluminescence of PL layer 205 and comparing the measured static photoluminescence to a second calibration curve, table, or function for the dopant concentration of PL layer 205 that is determined based on transient photoluminescence.

As noted above, optical assembly 240 is configured to direct excitation light 201 to PL layer 205 and to direct PL emission 202 to detector 230. Optical assembly 240 can include any of various configurations, depending on the which film characteristic or characteristics of PL layer 205 are determined by computing device 250. The configuration of optical assembly can also depend on which information associated with PL emission 202 is employed by computing device 250 to determine the film characteristic or characteristics of PL layer 205.

As noted above, PL emission 202 is generated by PL layer 205 when excitation light 201 is incident on PL layer 205. More specifically, atoms within a host material of PL layer 205 and/or a dopant material in PL layer 205 contribute to the generation of PL emission 202. The host material of PL layer 205 can include any PL material, which is a material that emits light by photoexcitation, i.e. in response to the absorption of photons. For example, the organic semiconductors included in OLED devices are typically PL materials. Examples of such host PL materials include CBP (4,4'-Bis(N-carbazolyl)-1,1'-Biphenyl), TCTA (4,4',4"-Tris (carbazole-9-yl)triphenylamine) or TPBi (2,2',2"-(1,3,5-Benzinetriyl)-tris(1-phenyl-1-H-benzimidazole)). Examples of dopant materials that can be included in PL layer 305 include green emitter molecules like $Ir(ppy)_2(acac)$ (Bis[2-(2-pyridinyl-N)phenyl-C](acetylacetonato)iridium(III)) (green emitter), red emitter molecules like $Ir(btpy)_3$ (Tris(2-(benzo[b]thiphen-2-yl)pyridineiridium(III)) and blue emitter molecules like Bebq2 (Bis(10-hydroxybenzo[h]quinolinato)beryllium). PL emission 202 can include photons emitted via fluorescence, phosphorescence, or a combination of both, as illustrated in FIGS. 3A and 3B.

Figure 3A:
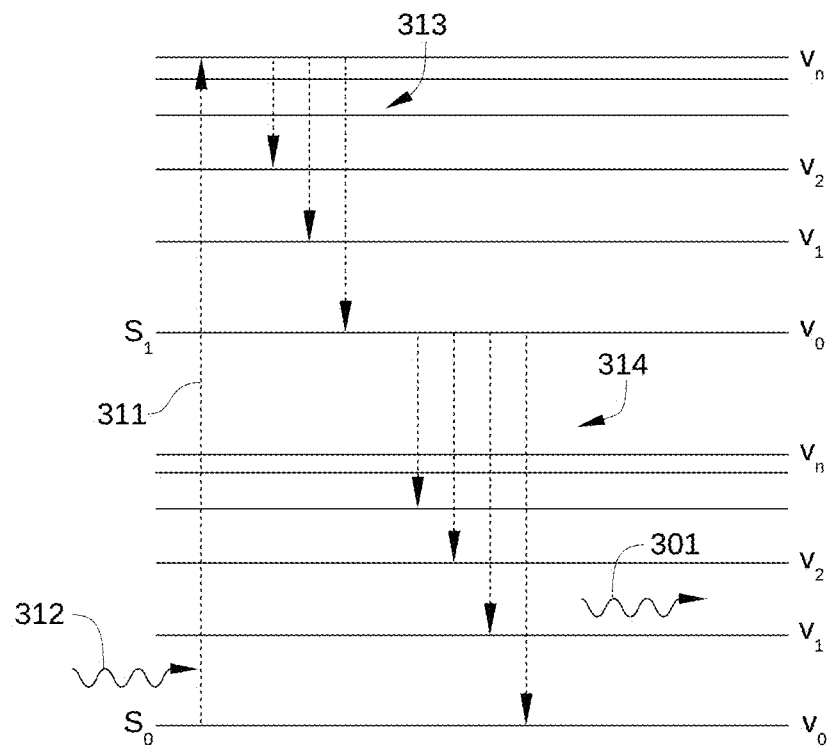
FIG. 3A is an energy diagram illustrating the emission of fluorescent light from a photoluminescent (PL) material, according to various embodiments of the present disclosure
Figure 3B:
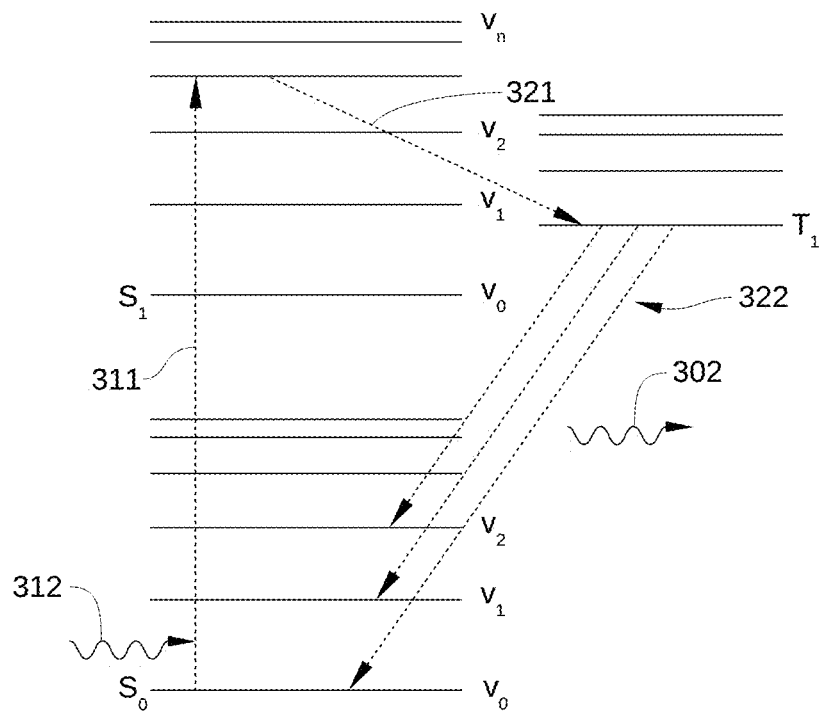
FIG. 3B is an energy diagram illustrating the emission of phosphorescent light from a PL material, according to various embodiments of the present disclosure.

FIG. 3A is an energy diagram illustrating the emission of fluorescent light 301 from a fluorescent material, and FIG. 3B is an energy diagram illustrating the emission of phosphorescent light 302 from a phosphorescent material, according to various embodiments of the present disclosure. As shown in FIG. 3A, the emission of fluorescent light 301 (i.e., fluorescence) occurs from vibrational state $v_0$ of excited singlet $S_1$ down to $S_0$ (and its vibrational levels). When absorption 311 of incident light 312 that exceeds the bandgap of the PL material (typically in the visible to ultra-violet range) occurs, electrons in the PL material are excited to higher vibrational states of $S_1$. These excited vibrational energy states relax via non-radiative transfer 313 to the ground vibrational state of $S_1$. Eventually the molecules of the PL material relax 314 to a ground electronic state $S_0$, emitting fluorescent light 301. Usually fluorescence occurs at a wavelength that is significantly red-shifted from the excitation wavelength (Stokes shift), and is unique for every fluorescent material. Typical fluorescence lifetimes range between femtoseconds (fs) to picoseconds (ps).

As shown in FIG. 3B, the emission of phosphorescent light 302 (i.e., phosphorescence) occurs from higher triplet state $(T_1)$ to singlet ground state $(S_0)$ after the singlet excitation undergoes the inter-system crossing 321 from higher singlet $(S_1)$ of the host PL material to the higher triplet state $(T_1)$ of a dopant material within the PL material. Relaxation 322 of molecules from $T_1$ to $S_0$ emits Stokes' shifted photons collectively known as phosphorescence (phosphorescent light 302). The decay lifetimes are very long ranging anywhere between nanoseconds (ns) to milliseconds (ms) and even hours, depending on the PL material and surrounding conditions. As employed herein, the term "photoluminescence" is a collective term for material emission processes that include fluorescence, phosphorescence, or a combination of both. Thus, PL emission 202 of FIG. 2 can include fluorescent light 301, phosphorescent light 302, or a combination of both.

It is noted that incident light 312 generally includes a first wavelength or group of wavelengths, while fluorescent light 301 includes a second wavelength or group of wavelengths that is different from the first wavelength or group of wavelengths. Similarly, phosphorescent light 302 includes a third wavelength or group of wavelengths that is different from the first wavelength or group of wavelengths. Thus, while the energy that causes the generation of PL emission 202 originates from excitation light 201, the light making up PL emission 202 includes different photons at different energies than the photons of excitation light 201.

According to some embodiments, excitation light 201 includes light in the visible light spectrum, i.e., light of wavelengths from about 400 nm to about 700 nm. According to some embodiments, excitation light 201 includes light in the near-infrared spectrum, which includes light of wavelengths from about 700 nm to about 800 nm. According to some embodiments, excitation light 201 includes light in the mid-infrared spectrum, which includes light of wavelengths from about 800 nm to about 3000 nm (3 microns). According to some embodiments, excitation light 201 includes light in the near ultraviolet spectrum, which includes light of wavelengths from about 100 nm to about 400 nm. It is noted that X-rays are generally considered to include light of wavelengths of about 0.01 nm to about 10 nm, and which does not overlap with the wavelengths of light in the near ultraviolet spectrum. Thus, unlike analytical techniques that employ X-rays to generate fluorescent emissions, such as X-ray fluorescence (XRF), embodiments described herein employ much less energetic photons to generate PL emission 202. In some embodiments, PL emission 202 includes light having a wavelength in the visible spectrum. Alternatively or additionally, in some embodiments, PL emission 202 includes light having a wavelength in the near infra-red spectrum and/or the mid-infrared spectrum. In some embodiments, PL emission 202 includes light having a wavelength in the near-visible spectrum, which can include light from the near infra-red spectrum to the near ultraviolet spectrum.

Figure 4:
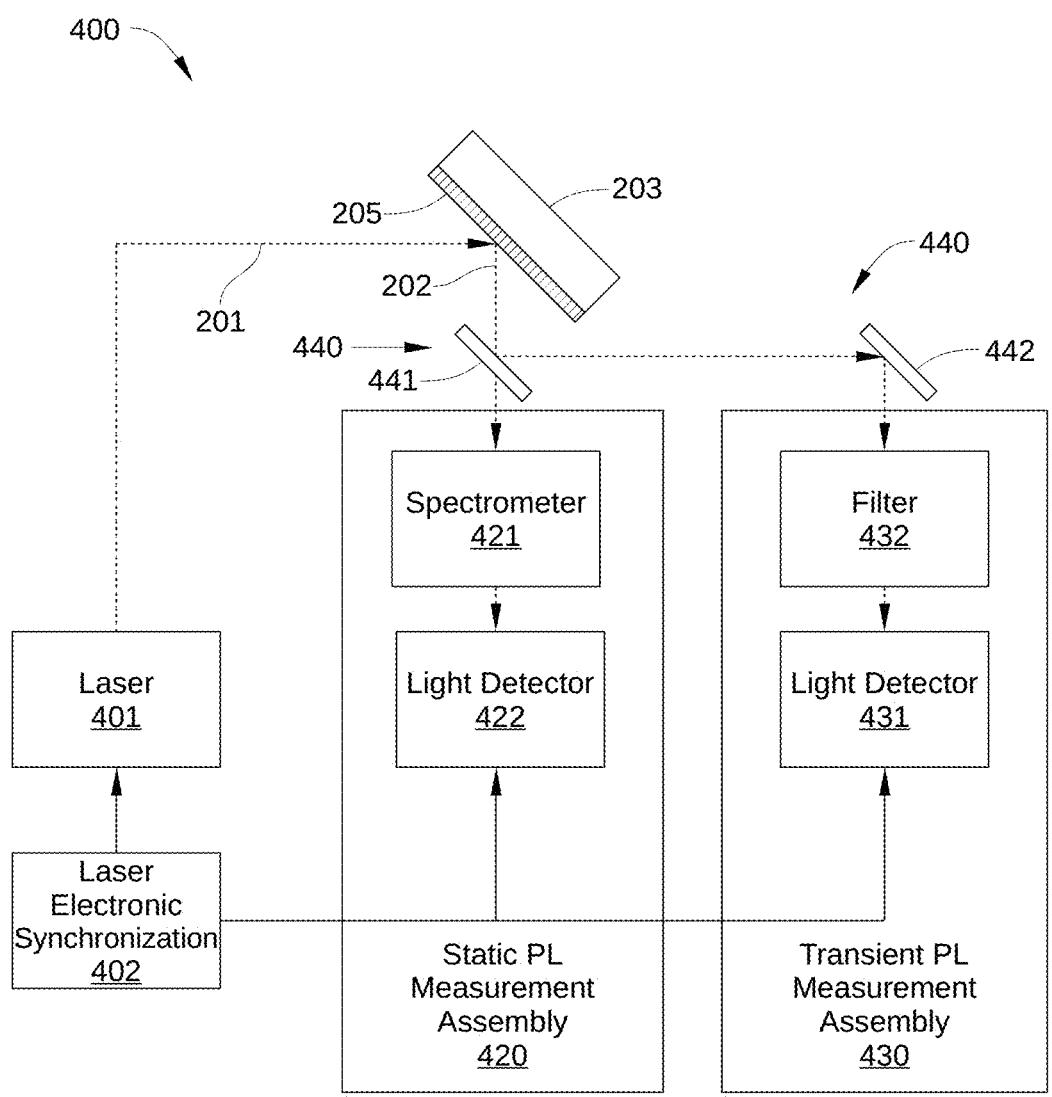
FIG. 4 is a schematic diagram illustrating an OLED monitoring system, configured according to various embodiments of the present disclosure.

In some embodiments, an OLED monitoring system is configured to determine one or more film characteristics of a PL layer by measuring both static photoluminescence and/or transient photoluminescence of a PL material. One such embodiment is illustrated in FIG. 4. FIG. 4 is a schematic diagram illustrating an OLED monitoring system 400, configured according to various embodiments of the present disclosure. OLED layer monitoring system 400 includes a laser 401, a laser electronic synchronization module 402, a static photoluminescence measurement assembly 420 that acts as a first detector, and a transient photoluminescence measurement assembly 430 that acts as a second detector. In some embodiments, OLED layer monitoring system 400 further includes an optical assembly 440 that directs the excitation light 201 and PL emission 202 as shown. Optical assembly 440 can include free-space optical elements, such as a beam splitter 441 and mirror 442, and/or fiber optic elements (not shown). OLED layer monitoring system 400 typically also includes a computing device for receiving signals from static photoluminescence measurement assembly 420 and transient photoluminescence measurement assembly 430 and for determining one or more film characteristics of PL layer 205. For clarity, the computing device of OLED layer monitoring system 400 is omitted in FIG. 4.

Laser 401 is a laser configured to generate timed pulses on a time scale that corresponds to the PL decay period of PL layer 205 when excited by a suitable frequency of incident light. For example, in some embodiments, laser 401 is configured to generate timed pulses on the picoseconds (ps) timescale. Laser electronic synchronization module 402 synchronizes the output of laser 401 with the data collection of static photoluminescence measurement assembly 420 and transient photoluminescence measurement assembly 430.

Static photoluminescence measurement assembly 420 is configured to measure steady-state photoluminescence of PL layer 205 when PL layer 205 is excited by laser 401. In embodiments in which PL layer 205 is excited by laser 401, laser 401 can operate either as a continuous-wave (CW) laser or pulsed laser. In some embodiments, static photoluminescence measurement assembly 420 is configured to measure spectral information associated with PL emission 202. In such embodiments, static photoluminescence measurement assembly 420 includes a spectrometer 421 for spatially separating the frequencies of PL emission 202 and a light detector 422 for quantifying the radiant intensity for each wavelength of interest in PL emission 202. Alternatively, spectrometer 421 can be replaced by any suitable optical element or elements that spatially disperse the various frequencies of light included in PL emission 202. In some embodiments, light detector 422 includes an array of light detectors, such as a CCD array or CMOS array, where each light detector in the array measures a radiant intensity for a particular wavelength or wavelength band of interest. Thus, in operation, static photoluminescence measurement assembly 420 generates an intensity spectrum of PL emission 202 that facilitates measurement of one or more film characteristics of PL layer 205. Examples of such PL intensity spectra are illustrated in FIGS. 5A and 5B.

Figure 5A:
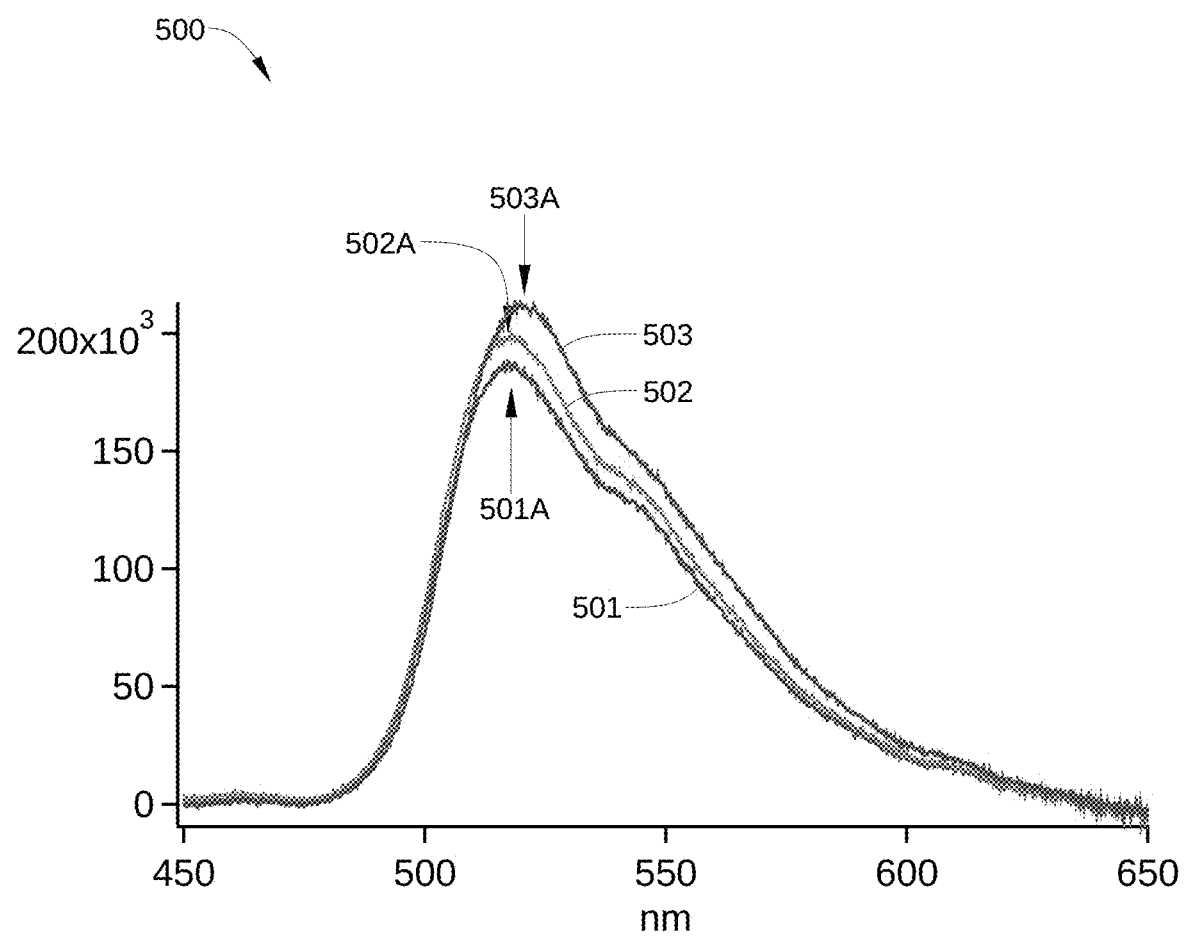
FIG. 5A is a graph illustrating multiple PL intensity spectra generated via a static photoluminescence measurement assembly that demonstrate PL peak intensity variation with respect to dopant concentration, according to an embodiment of the present disclosure.
Figure 5B:
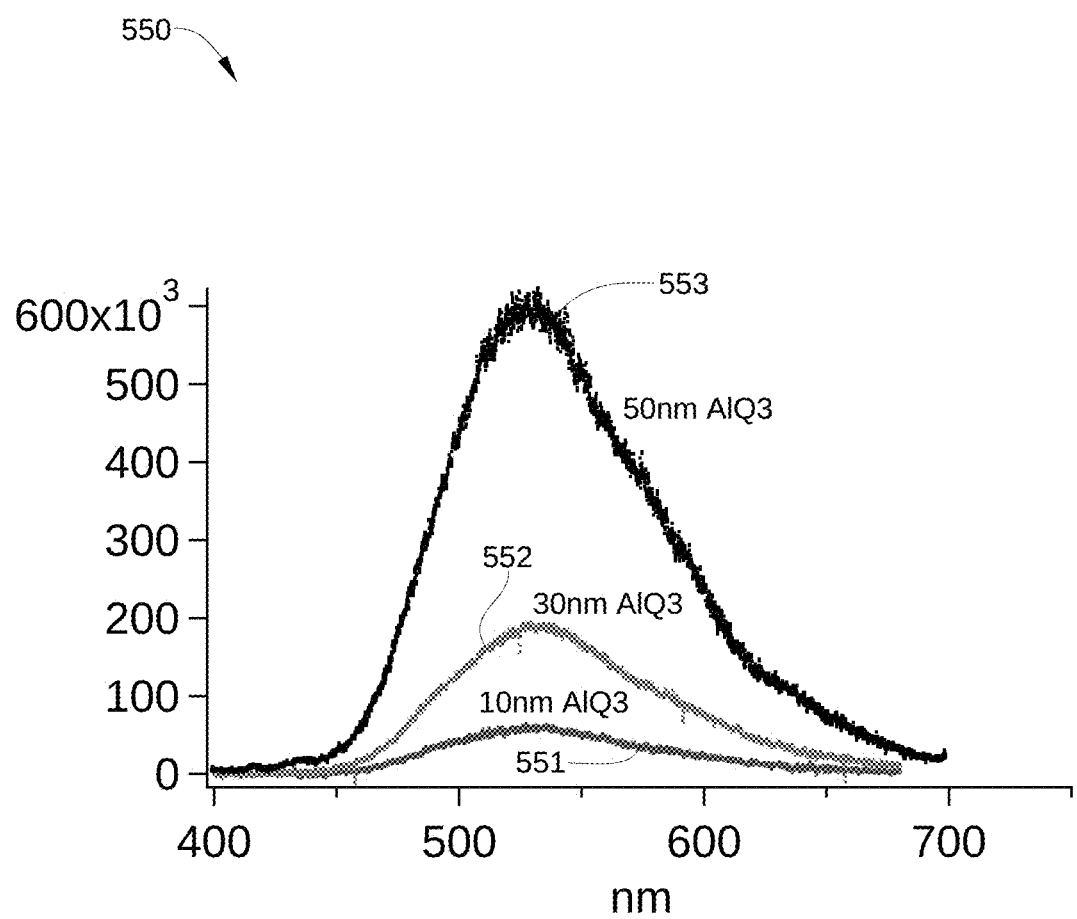
FIG. 5B is a graph illustrating multiple PL intensity spectra generated via a static photoluminescence measurement assembly that demonstrate PL peak intensity variation with respect to PL thickness, according to an embodiment of the present disclosure.

FIG. 5A is a graph 500 illustrating multiple PL intensity spectra 501-503 generated via static photoluminescence measurement assembly 420 that demonstrate PL peak intensity variation with respect to dopant concentration, according to an embodiment of the present disclosure. Each of PL intensity spectra 501-503 is generated for a different 50 nm thick PL layer 205 of Tris(4-carbazoyl-9-ylphenyl)amine (TCTA) that contains the dopant Ir(ppy)$_2$(acac). Specifically, PL intensity spectrum 501 is generated for a TCTA layer that includes 1% Ir(ppy)$_2$(acac), PL intensity spectrum 502 is generated for a TCTA layer that includes 3% Ir(ppy)$_2$ (acac); and PL intensity spectrum 503 is generated for a TCTA layer that includes 7% Ir(ppy)$_2$(acac). As shown, the magnitude of peak intensities 501A, 502A, and 503A varies as a function of dopant concentration, where increasing dopant concentration in the TCTA layer results in an increase in the magnitude of peak intensity. Specifically, in the embodiment illustrated in FIG. 5A, the magnitude of peak intensities 501A, 502A, and 503A are 186279±2.7%, 198084±2.9%, and 211718±1.9%, respectively. In addition, the peak wavelength of PL intensity spectra 501-503 increases (i.e., redshifts) with increasing dopant concentration. Specifically, in the embodiment illustrated in FIG. 5A, the peak wavelengths of PL intensity spectra 501-503 are 517.89 nm, 518.20 nm, and 520.69 nm, respectively.

Thus, in some embodiments, for a known thickness of PL layer 205 of a particular PL material, a PL intensity spectrum generated by static photoluminescence measurement assembly 420 can indicate the concentration of dopant included in PL layer 205. In such embodiments, a computing device of OLED layer monitoring system 400 compares a PL intensity spectrum for the PL layer 205 of known thickness to previously established calibration curves for that thickness of PL layer 205 and determines the concentration of dopant in the PL layer 205 of known thickness. Alternatively or additionally, the computing device of OLED layer monitoring system 400 can determine a specific value from the PL intensity spectrum for the PL layer 205 of known thickness, such as a magnitude of the peak intensity of the PL intensity spectrum and/or a wavelength of the peak intensity of the PL intensity spectrum. The computing device then compares the specific value or values to a previously established calibration table or function to determine the concentration of dopant in the PL layer 205 of a known thickness. It is noted that for each particular thickness and particular PL material, a different calibration process is typically employed for determining the concentration of dopant included in PL layer 205.

Conversely, when PL layer 205 includes a known concentration of dopant, a PL intensity spectrum generated by static photoluminescence measurement assembly 420 enables the computing device of OLED layer monitoring system 400 to determine the thickness of PL layer 205 using calibration curves, tables, or functions in a similar fashion. For example, FIG. 5B is a graph 550 illustrating multiple PL intensity spectra 551-553 generated via static photoluminescence measurement assembly 420 that demonstrate PL peak intensity variation with respect to PL thickness, according to an embodiment of the present disclosure. Each of PL intensity spectra 551-553 is generated for a respective PL layer 205 of a different thickness of Tris(8-hydroxyquinoline) aluminum(III), commonly known as AlQ3. Specifically, PL intensity spectrum 551 is generated for a first AlQ3 layer that is 10 nm thick, PL intensity spectrum 552 is generated for a second AlQ3 layer that is 30 nm thick, and PL intensity spectrum 553 is generated for a third AlQ3 layer that is 50 nm thick, where the first, second, and third layers each have the same dopant concentration. As shown, the magnitude of the peak intensities of PL intensity spectra 551-553 varies significantly as a function of dopant concentration.

Returning to FIG. 4, transient photoluminescence measurement assembly 430 is configured to measure transient photoluminescence of PL layer 205 when PL layer 205 is excited by laser 401. In some embodiments, transient photoluminescence measurement assembly 430 is configured to measure PL intensity information associated with PL emission 202 via time-correlated single photon counting (TCSPC). In TCSPC, the time-dependent intensity profile of PL emission 202 is recorded in the time domain when PL emission 202 occurs upon excitation by a short flash of light, such as a laser pulse from laser 401. In such embodiments, transient photoluminescence measurement assembly 430 includes a light detector 431 that is configured for the precisely timed registration of single photons of PL emission 202. For example, in some embodiments, light detector 431 includes a single-photon sensitive detector, such as a photomultiplier tube (PMT), a micro channel plate (MCP), a single photon avalanche diode (SPAD), or a hybrid PMT. For sufficient sensitivity in measuring the time decay of PL emission 202, in some embodiments, the measurements of PL emission 202 by light detector 431 are based on precisely times repetitive excitations of PL layer 205. The reference for the timing of the excitations and associated measurements can be the corresponding excitation pulse, which is provided by laser electronic synchronization module 402. In operation, transient photoluminescence measurement assembly 430 generates a PL intensity decay curve that facilitates measurement of one or more film characteristics of PL layer 205. Examples of such PL intensity decay curves are illustrated in FIG. 6.

Figure 6:
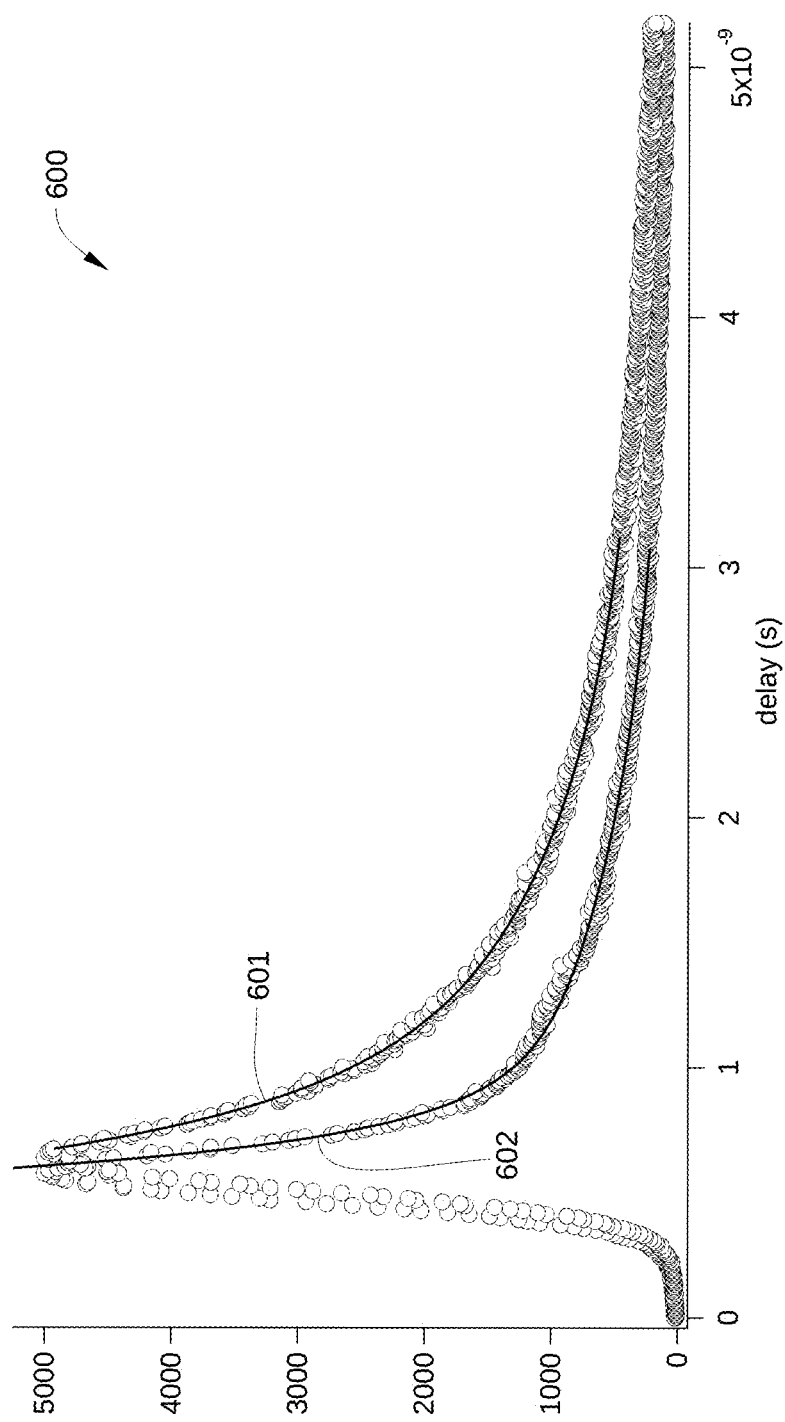
FIG. 6 is a graph illustrating a first PL intensity decay curve and a second PL intensity decay curve generated via a transient photoluminescence measurement assembly that demonstrate variation of PL intensity decay as a function of dopant concentration, according to an embodiment of the present disclosure.

FIG. 6 is a graph 600 illustrating a first PL intensity decay curve 601 and a second PL intensity decay curve 602 generated via transient photoluminescence measurement assembly 430 that demonstrate variation of PL intensity decay as a function of dopant concentration, according to an embodiment of the present disclosure. First PL intensity decay curve 601 and second PL intensity decay curve 602 are each generated for a different 50 nm thick PL layer 205 of TCTA that contains the dopant $(ppy)_2Ir(acac)$. Specifically, first PL intensity decay curve 601 is generated for a PL layer 205 that includes 5% $(ppy)_2Ir(acac)$ and second PL intensity decay curve 602 is generated for a PL layer 205 that includes 7% $(ppy)_2Ir(acac)$. The PL intensity counts (Y-axis of graph 600) are shown in arbitrary units, and depict the discrete intensities of light, such as counts, measured over time after PL layer 205 is excited by excitation light 201.

In contrast to the PL intensity spectra 501-503 of FIG. 5, in the embodiment illustrated in FIG. 6, each data point is based on a number of photons measured by transient photoluminescence measurement assembly 430 over a single band of wavelengths, such as 520-530 nm (green emitters) or 620-630 nm (red emitters). That is, spectral dispersion of PL emission 202 is not performed, and photons within a predetermined range of wavelengths of PL emission 202 are measured. To that end, in some embodiments, transient photoluminescence measurement assembly 430 also includes an optical filter 432 that is configured to limit the wavelengths of PL emission 202 received by transient photoluminescence measurement assembly 430 to the predetermined range of wavelengths. In general, the predetermined range of wavelengths that is sampled by transient photoluminescence measurement assembly 430 is a relatively wide band compared to each of the wavelength bands associated with each data point in the PL intensity spectra 501-503 of FIG. 5. Furthermore, the predetermined range of wavelengths sampled by transient photoluminescence measurement assembly 430 can be selected based on the host material and/or dopant material of PL layer 205.

As illustrated by first PL intensity decay curve 601 and second PL intensity decay curve 602, the decay over time of the intensity of PL emission 202 after a discrete excitation by incident light varies as a function of dopant concentration, but not thickness of PL layer 205. That is, increasing dopant concentration in PL layer 205 results in an increase in the rate of decay of PL emission 202, while a change in thickness of PL layer 205 has no significant effect on the rate of decay of PL emission 202. As a result, in some embodiments, a PL intensity decay curve generated by transient photoluminescence measurement assembly 430 can indicate the concentration of dopant included in PL layer 205. In such embodiments, PL intensity values are collected at different times after a triggering laser pulse from laser 401 excites a PL layer 205 that includes a particular host material and dopant material. The computing device of OLED layer monitoring system 400 then constructs a PL intensity curve similar to first PL intensity decay curve 601 or second PL intensity decay curve 602, and compares the constructed PL intensity decay curve to previously established calibration curves for a similar PL layer 205. Based on the comparison, the computing device determines dopant concentration in PL layer 205. In such embodiments, any suitable curve-fitting algorithm can be employed by the computing device to determine dopant concentration in PL layer 205.

In one such embodiment, the computing device of OLED layer monitoring system 400 can determine a value for a fitting parameter for the PL intensity decay curve constructed for a PL layer 205. The computing device then determines a dopant concentration of PL layer 205 based on that specific value of the fitting parameter. For example, the computing device can determine a dopant concentration by comparing the specific value of the fitting parameter to a calibration table of previously established values for the fitting parameter that is generated using PL layers having a known dopant concentration. In such an embodiment, a double-exponent fitting equation, such as Equation 1, can be employed to determine a PL intensity decay curve for a known dopant concentration that most closely matches the PL intensity decay curve constructed for PL layer 205.

$$Y = Y_0 + A_1 \exp\left\{\frac{-(x - x_0)}{\tau_1}\right\} + A_2 \exp\left\{\frac{-(x - x_0)}{\tau_2}\right\} \qquad (1)$$

Figure 7:
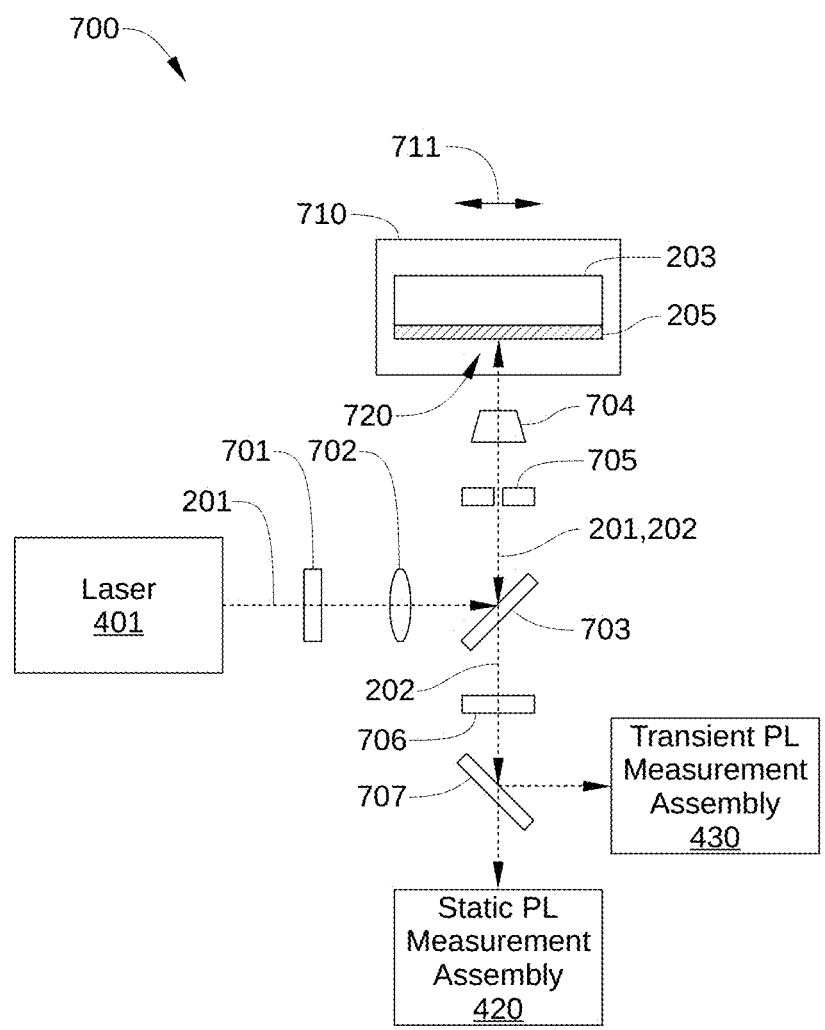
FIG. 7 is a schematic illustration of an OLED monitoring system, configured according to various embodiments of the present disclosure.

In equation 1, Y0 is a y-axis (PL count) offset, X0 is a x-axis(time delay) constant, and $A_1$, $A_2$, $\tau_1$, and $\tau_2$ are additional fitting parameters. In embodiments in which Equation 1 is employed to determine a dopant concentration of PL layer 205, $T_2$ can be selected as the fitting parameter that is compared to known calibration values. For example, in the embodiment illustrated in FIG. 6, for intensity decay curve 601, $A_1$=2137, $A_2$=2568, $\tau_1$=220 ps and $\tau_2$=1.04 ns, whereas for intensity decay curve 602 $A_1$=3693, $A_2$=1506, $\tau_1$=135.6 ps, and $\tau_2$=1.15 ns In some embodiments, an OLED monitoring system includes free-space optical elements for directing excitation light from a light source to a PL layer, and for directing a PL emission from the PL layer to one or more detectors. One such embodiment is illustrated in FIG. 7. FIG. 7 is a schematic illustration of an OLED monitoring system 700, configured according to various embodiments of the present disclosure. OLED monitoring system 700 includes one or more free-space optical elements that interact with and/or direct excitation light 201, PL emission 202, or both excitation light 201 and PL emission 202.

For example, in some embodiments, OLED monitoring system 700 includes one or more filters 701, such as a neutral-density filter or other optical filter for modifying the intensity or color distribution of excitation light 201. In some embodiments, OLED monitoring system 700 includes one or more lenses 702 to shape and/or focus excitation light 201. In some embodiments, OLED monitoring system 700 includes a dichroic mirror 703 that is highly reflective for wavelengths associated with excitation light 201 (e.g., on the order of about 400 nm) and highly transmissive for wavelengths associated with PL emission 202 (e.g., on the order of about 600 nm). In some embodiments, OLED monitoring system 700 includes an objective lens 704 configured to focus excitation light 201 onto a measuring location 720 on PL layer 205. In such embodiments, objective lens 704 may also be configured to focus PL emission 202 onto static PL measurement assembly 420 and/or transient PL measurement assembly 430. In some embodiments, OLED monitoring system 700 includes a confocal pinhole 705 that is configured to block out-of-focus excitation light 201 and is positioned between objective lens 704 and laser 401. In some embodiments, OLED monitoring system 700 includes a filter 706, such as a notch filter, configured to stop unwanted frequencies of light from reaching static PL measurement assembly 420 and/or transient PL measurement assembly 430, such as frequencies associated with excitation light 201. In some embodiments, OLED monitoring system 700 includes a beam-splitter 707 configured to direct a portion of PL emission 202 to static PL measurement assembly 420 and a portion of PL emission 202 to transient PL measurement assembly 430. In some embodiments, OLED monitoring system 700 includes static PL measurement assembly 420 and/or transient PL measurement assembly 430.

In some embodiments, OLED monitoring system 700 includes additional optical elements or fewer optical elements than those depicted in FIG. 7. Further, in some embodiments, one or more of the free-space optical elements depicted in FIG. 7 can be replaced with one or more fiber-based components of substantially equivalent functionality.

In some embodiments, OLED monitoring system 700 controls or is communicatively connected to a movable stage 710 for translating substrate 203 relative to objective lens 704. In such embodiments, movable stage 710 is configured to translate substrate 203 in a direction perpendicular to the direction of incident excitation light 201. In such embodiments, stage 710 is configured to translate horizontally, i.e., in the direction indicated by arrow 711, or vertically, i.e., out of the page in FIG. 7. In some embodiments, movable stage 710 is an X-Y stage configured to translate substrate 203 both horizontally and vertically, so that excitation light 201 can be directed to a plurality of measurement locations 720 that are distributed in two dimensions on PL layer 205. Alternatively or additionally, in some embodiments, movable state 710 is further configured with additional motion capability, such as Z-motion (which is perpendicular to X- and Y-motion) and rotational motion, for example to offset correction of focal length sensitivity.

In some embodiments, movable stage 710 is disposed within the process chamber that has deposited PL layer 205. In one such embodiment, movable stage 710 is disposed within the deposition chamber that has deposited PL layer 205, and measurements of PL layer 205 are performed before substrate 203 is removed from the deposition chamber. In another embodiment, movable stage 710 is disposed within the deposition system but outside the deposition chamber that has deposited PL layer 205. For example, movable stage 710 can be disposed within a transfer chamber of the deposition system, and measurements of PL layer 205 are performed after substrate 203 is removed from the deposition chamber that has deposited PL layer 205.

In the embodiment illustrated in FIG. 7, OLED monitoring system 700 directs excitation light 201 to a single measuring location 720 on PL layer 205. In other embodiments, when substrate 203 is in a particular position relative to OLED monitoring system 700, OLED monitoring system 700 is configured to direct excitation light 201 to multiple measuring locations 720 on PL layer 205. For example, in one such embodiment, OLED monitoring system 700 includes a linear array of N objective lenses 704 that extends out of the page. Thus, OLED monitoring system 700 is configured to direct excitation light 201 to N locations on PL layer 205 without repositioning substrate 203. As a result, PL emission 202 can be generated at the N locations on PL layer 205 and measured by static photoluminescence measurement assembly 420 and/or transient photoluminescence measurement assembly 430 without repositioning movable stage 710. In such an embodiment, movable stage 710 is typically configured to translate substrate 203 along a single direction perpendicular to the direction of incident excitation light 201, i.e., either vertically or horizontally.

Figure 8:
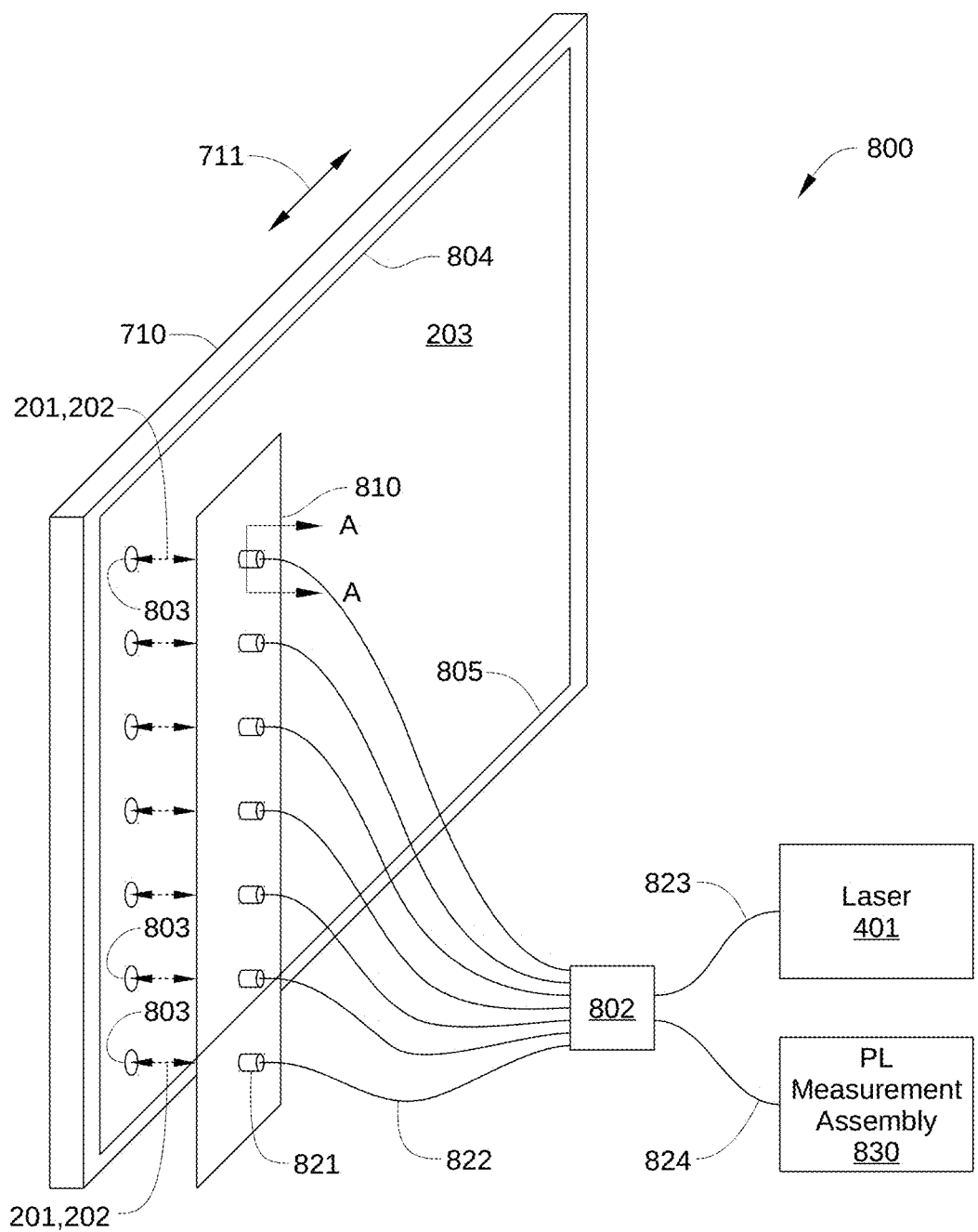
FIG. 8 is a schematic illustration of a fiber-based OLED monitoring system, configured according to various embodiments of the present disclosure.

In some embodiments, an OLED monitoring system includes one or more optical-fiber-based components. One such embodiment is illustrated in FIG. 8. FIG. 8 is a schematic illustration of a fiber-based OLED monitoring system 800, configured according to various embodiments of the present disclosure. OLED monitoring system 800 includes one or more optical-fiber-based components that interact with and/or direct excitation light 201, PL emission 202, or both excitation light 201 and PL emission 202.

In some embodiments, OLED monitoring system 800 includes an array 810 that includes a plurality of probes 821. Each of probes 821 is coupled to a fiber optic splitter 802 via a fiber bundle 822, where each fiber bundle 822 includes at least one fiber (not shown) for directing excitation light 201 to a probe 821 and at least one fiber (not shown) for directing PL emission 202 from the probe 821. In addition, fiber optic splitter 802 is coupled to laser 401 via an optical fiber 823 and a PL measurement assembly 830 via an optical fiber 824. Thus, each of probes 821 is coupled to laser 401 and PL measurement assembly 830 via fiber optic splitter 802 and various optical fibers. In some embodiments, PL measurement assembly 830 includes the functionality of static PL measurement assembly 420, transient PL measurement assembly 430, or a combination of both.

Each of probes 821 is configured to direct excitation light 201 to a particular measurement location 803 on substrate 203. In addition, each of probes 821 is configured to receive PL emission 202 and transmit PL emission 202 to PL measurement assembly 830 via fiber optic splitter 802.

In the embodiment illustrated in FIG. 8, array 810 is a linear array that is configured to facilitate PL measurements from one edge of substrate 203 (e.g., a top edge 804) to an opposing edge of substrate 203 (e.g., a bottom edge 805) without repositioning substrate 203 via movable stage 710. In other embodiments, array 810 extends across a portion of substrate 203 rather than from top edge 804 to bottom edge 805. In some embodiments, array 810 is a two-dimensional array of probes 821 rather than a linear array of probes. Furthermore, in some embodiments, array 810 is disposed within a vacuum chamber of the deposition system that deposits one or more PL layers on substrate 203. Alternatively, in some embodiments, array 810 is disposed outside of such a deposition system. In such embodiments, probes 821 are each configured to direct excitation light 201 onto substrate 203 through a respective window in the deposition system and to receive PL emission 202 through the respective window of the deposition system.

Figure 9:
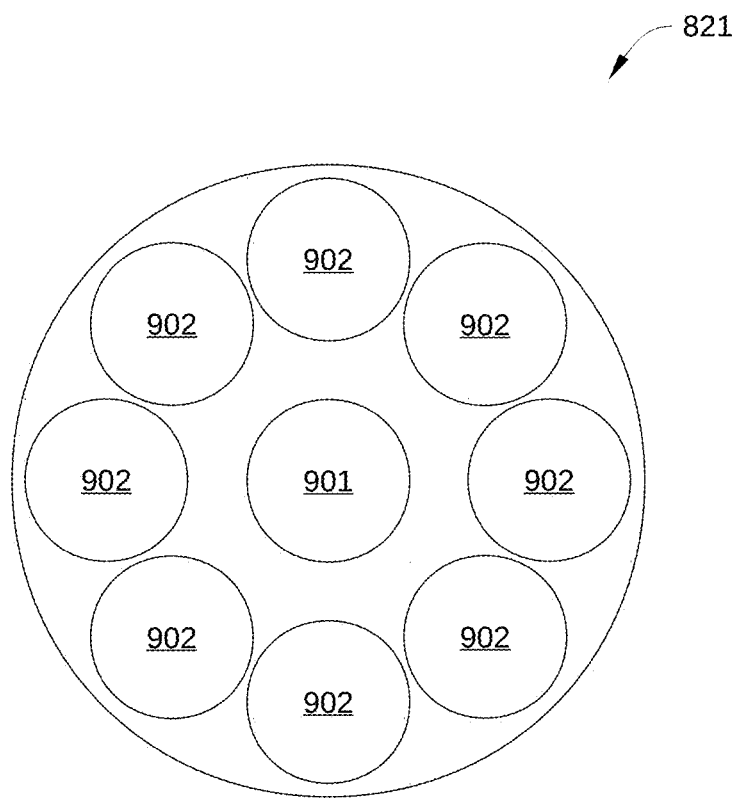
FIG. 9 is a schematic cross-sectional view of a probe of an array in the fiber-based OLED monitoring system of FIG. 8, according to various embodiments of the present disclosure.

In some embodiments, each of probes 821 includes more than a single optical fiber for directing excitation light to substrate 203 and/or more than a single optical fiber for directing PL emission 202 from substrate 203 to PL measurement assembly 830. One such embodiment is illustrated in FIG. 9. FIG. 9 is a schematic cross-sectional view of a probe 821 of array 810, according to various embodiments of the present disclosure. The cross-sectional view of FIG. 9 is taken at section A-A in FIG. 8. In the embodiment illustrated in FIG. 9, probe 821 includes an emission-receiving fiber 901 and a plurality of excitation-light-transmitting fibers 902 arranged around emission-receiving fiber 901. In alternative embodiments, probe 821 includes multiple emission-receiving fibers 901. Probes 821 can include any other technically feasible configuration of emission-receiving fibers 901 and excitation-transmitting fibers 902 without exceeding the scope of the present disclosure.

Figure 10:
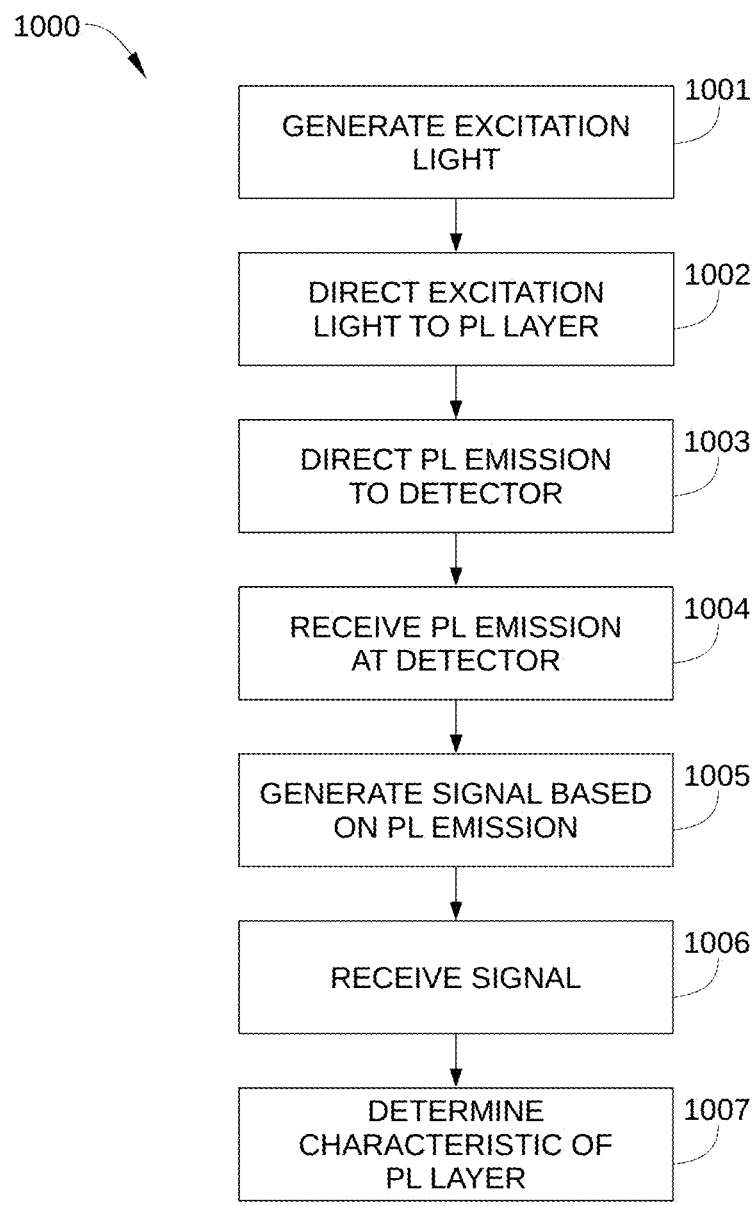
FIG. 10 is a flow chart of process steps for determining a film characteristic of the PL material, according to various embodiments of the disclosure.

According to various embodiments, an OLED monitoring system can determine one or more film characteristics of a PL material formed on a substrate within a system that has deposited the PL material. FIG. 10 is a flow chart of process steps for determining a film characteristic of the PL material, according to various embodiments of the disclosure.

A method 1000 begins in step 1001, in which light source 220 generates excitation light 201.

In step 1002, one or more components of optical assembly 240 direct excitation light 201 onto PL layer 205 formed on substrate 203, while substrate 203 is disposed in deposition system 290. The one or more components of optical assembly 240 may include free-space optical elements, fiber-based optical elements, or a combination of both.

In step 1003, in response to excitation light 201 interacting with PL layer 205, one or more components of optical assembly 240 direct PL emission 202 to detector 230. The one or more components of optical assembly 240 may include free-space optical elements, fiber-based optical elements, or a combination of both.

In step 1004, detector 230 receives PL emission 202. In some embodiments, PL emission 202 includes a transient PL emission that decays over time, and in some embodiments, PL emission 202 includes a static PL emission that has a substantially a constant magnitude over time.

In step 1005, detector 230 generates a signal based on PL emission 202. In some embodiments, the signal includes static spectral intensity information, i.e., a static PL intensity for each of a plurality of wavelengths or wavelength bands. Alternatively or additionally, in some embodiments, the signal includes static spectral intensity information for a specific wavelength or wavelength band. In some embodiments, the signal includes time decay information of PL emission 202, for example in response to an excitation pulse from light source 220. In such embodiments, time decay information can be based on a single wavelength or wavelength band, or on a plurality of wavelengths or wavelength bands. In such embodiments, the measurement time is generally significantly longer when the time decay information is for each of a plurality of wavelengths or wavelength bands.

In step 1006, computing device 250 receives the signal generated in step 1005 from the detector.

In step 1007, computing device 250 determines one or more characteristics of PL layer 205 based on the signal received in step 1006, such as a thickness of PL layer 205 and/or a dopant concentration of PL layer 205. As set forth above, in some embodiments, computing device 250 can determine a dopant concentration of PL layer 205 based time decay information of PL emission 202 in the signal generated by detector 230. In some embodiments, computing device 250 can determine a thickness of PL layer 205 based on a dopant concentration (determined based on time decay information of PL emission 202) and on static spectral intensity information of PL emission 202. In some embodiments, computing device 250 can determine a dopant concentration of PL layer 205 based on static spectral intensity information of PL emission 202 and thickness information for PL layer 205. For example, the thickness information may be determined via reflectometry or some other technique that can be coupled together with the embodiments for PL metrology for OLED layers.

In some embodiments, computing device 250 determines one or more characteristics of PL layer 205 based on a plurality of measurements of PL emission 202, where each measurement is associated with a different measurement location. In such embodiments, computing device 250 can further determine a thickness uniformity of PL layer 205 and/or a dopant concentration uniformity of PL layer 205.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

While the foregoing is directed to embodiments of the present disclosure, other and further embodiments of the disclosure may be devised without departing from the basic scope thereof, and the scope thereof is determined by the claims that follow.

What is claimed is:

1. An apparatus, comprising:
    a light source that generates an excitation light that includes light from the visible or near-visible spectrum;
    an optical assembly configured to direct the excitation light onto a photoluminescent (PL);
    a detector that is configured to receive a PL emission, generated by the PL layer in response to the excitation light interacting with the PL layer, and generate a signal based on the PL emission; and
    a computing device coupled to the detector and configured to receive the signal from the detector and determine a characteristic of the PL layer based on the signal, wherein the characteristic of the PL layer determined by the computing device comprises a concentration of a dopant included in the PL layer, wherein the computing device is configured to determine the concentration of the dopant based on transient PL intensity information associated with the PL emission.

2. The apparatus of claim 1, wherein the excitation light comprises a first wavelength or group of wavelengths and the PL emission comprises a second wavelength or group of wavelengths that is different than the first wavelength or group of wavelengths.

3. The apparatus of claim 1, wherein the PL emission includes light having a wavelength in the visible spectrum.

4. The apparatus of claim 1, wherein the optical assembly includes:
    an objective lens configured to direct the excitation light to the PL layer; and
    a dichroic mirror configured to direct the excitation light to the objective lens and to transmit the PL emission.

5. The apparatus of claim 1, wherein the optical assembly includes a first optic fiber configured to direct at least a first portion of the excitation light to a first measuring location on the PL layer.

6. The apparatus of claim 5, wherein the optical assembly further includes a second optic fiber configured to direct a second portion of the excitation light to a second measuring location on the PL layer.

7. The apparatus of claim 6, wherein the optical assembly further includes:
    a third optical fiber that is configured to direct a first portion of the PL emission to the detector; and
    a fourth optical fiber that is configured to direct a second portion of the PL emission to the detector.

8. The apparatus of claim 6, wherein the optical assembly further includes an optical splitter configured to direct the first portion of the excitation light to the first optical fiber and the second portion of the excitation light to the second optical fiber.

9. The apparatus of claim 1, wherein the detector includes a detector array configured to generate a PL intensity value for each of a plurality of wavelengths, and the characteristic of the PL layer determined by the computing device includes a thickness of the PL layer at a specific location on the substrate.

10. The apparatus of claim 1, wherein the detector array comprises a linear array.

11. The apparatus of claim 10, wherein the linear array is configured to measure the PL emission from multiple locations on the surface of the substrate that extend from one side of the substrate to an opposing side of the substrate.

12. The apparatus of claim 1, wherein the computing device is configured to determine the concentration of the dopant based on a thickness of the PL layer and a static PL intensity value of the PL emission.

13. The apparatus of claim 1, wherein the transient PL intensity information includes a decay of PL intensity over time of the PL emission.

14. The apparatus of claim 1, wherein the computing device is configured to determine the concentration of the dopant based on a total photon count of the PL emission within a specific range of wavelengths.

15. A method of determining a characteristic of a photoluminescent (PL) layer that is formed on a substrate disposed in a system for depositing the PL layer, the method comprising:
    generating an excitation light that includes light from the visible or near-visible spectrum;
    receiving a PL emission generated by the PL layer in response to the excitation light interacting with the PL layer;
    generating a signal based on the PL emission; and
    determining the characteristic of the PL layer based on the signal, wherein the characteristic of the PL layer comprises a concentration of a dopant included in the PL layer and is based on transient PL intensity information associated with the PL emission.

16. The method of claim 15, wherein the excitation light comprises a first wavelength or group of wavelengths and the PL emission comprises a second wavelength or group of wavelengths that is different than the first wavelength or group of wavelengths.

17. An apparatus, comprising:
    a light source that generates an excitation light;

an optical assembly configured to direct the excitation light onto a photoluminescent (PL) layer formed on a substrate that is disposed in a system for depositing the PL layer;

a detector that is configured to receive a PL emission generated by the PL layer in response to the excitation light interacting with the PL layer, and generate a first signal and a second signal, wherein the first signal is based on the PL emission and includes a decay of PL intensity over time of the PL emission and the second signal is based on a total photon count of the PL emission within a specific range of wavelengths; and a computing device coupled to the detector and configured to:

receive the first signal from the detector and determine a concentration of a dopant in the PL layer based on the first signal; and receive the second signal from the detector and determine a thickness of the PL layer based on the second signal.

18. The apparatus of claim 17, wherein the detector is configured to receive the PL emission generated by the PL layer while the substrate is disposed in a deposition chamber of the system for depositing the PL layer.

19. The apparatus of claim 17, wherein the detector is configured to receive the PL emission generated by the PL layer while the substrate is disposed in a transfer chamber of the system for depositing the PL layer.

20. The apparatus of claim 17, wherein the detector is configured to receive the PL emission generated by the PL layer while the substrate is disposed in an end-of-line chamber of the system for depositing the PL layer.

21. The method of claim 15, wherein the PL layer comprises an organic layer.

* * * * *